United States Patent
Laskaris et al.

(10) Patent No.: US 7,053,740 B1
(45) Date of Patent: May 30, 2006

(54) LOW FIELD LOSS COLD MASS STRUCTURE FOR SUPERCONDUCTING MAGNETS

(75) Inventors: Evangelos Trifon Laskaris, Schenectady, NY (US); Xianrui Huang, Clifton Park, NY (US); Paul St. Mark Shadforth Thompson, Stephentown, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/182,622

(22) Filed: Jul. 15, 2005

(51) Int. Cl.
*H01F 6/00* (2006.01)

(52) U.S. Cl. ........................... 335/216; 324/319
(58) Field of Classification Search ........... 335/216, 335/296–301; 324/318–320
See application file for complete search history.

(56) References Cited

U.S. PATENT DOCUMENTS 5,410,286 A * 4/1995 Herd et al. ............... 335/216
2005/0104701 A1 5/2005 Huang et al. ............. 335/300

FOREIGN PATENT DOCUMENTS

JP 62013010 A * 1/1987

\* cited by examiner

*Primary Examiner*—Ramon M. Barrera
(74) *Attorney, Agent, or Firm*—Fletcher Yoder

(57) ABSTRACT

A structure for superconducting magnets is provided. The structure includes a thermally conductive electrically resistive composite bobbin, a superconducting coil disposed around the thermally conductive electrically resistive composite bobbin for conducting current in a superconductive state. The structure also includes an electrically open cryogenic coil disposed on the thermally conductive composite electrically resistive bobbin, which can receive a flow of cryogenic fluid to maintain the superconducting coil in the superconductive state by transfer of heat from the superconducting coil to the electrically open cryogenic coil through the thermally conductive electrically resistive composite bobbin.

23 Claims, 6 Drawing Sheets

US 7,053,740 B1

LOW FIELD LOSS COLD MASS STRUCTURE FOR SUPERCONDUCTING MAGNETS

BACKGROUND

The invention relates generally to superconducting magnets, and more particularly to a low-AC loss cold mass structure for superconducting magnets and a process for manufacturing the cold mass structure.

A number of applications exist for superconducting magnets. For example, magnetic resonance imaging (MRI) systems utilize superconducting magnets to generate a strong, uniform magnetic field within which a patient or other subject is placed. Magnetic gradient coils and radio-frequency transmit and receive coils then influence gyromagnetic materials in the subject to provoke signals that can be used to form useful images. Other systems that use such coils include spectroscopy systems, magnetic energy storage systems, and superconducting generators.

In many superconducting magnet assemblies, a superconducting magnet is disposed in a vacuum vessel that insulates the magnet from the environment during operation. The vacuum vessel of MRI and similar magnets is generally made of components that are welded together during assembly of the magnet to form a pressure boundary. The function of the vacuum vessel of an MRI magnet is to provide a reliable pressure boundary for maintaining proper vacuum operation. Vacuum vessels known in the art are usually made of metals such as stainless steel, carbon steel and aluminum. Although, metal vacuum vessels are strong enough to resist vacuum forces, they generate eddy currents and unwanted field distortions in the imaging volume when exposed to an AC field.

The cold mass of a conventional superconducting magnet consists of one or several superconducting coils, a coil support structure and a helium vessel. The helium vessel is a pressure vessel located within the vacuum vessel for thermal isolation. Typically, liquid helium in the helium vessel provides cooling for the coils and maintains the cold mass at a temperature of around 4.2 Kelvin, for superconducting operation. The coils themselves are wrapped around the coil support structure.

Metals, such as stainless steel or aluminum, are usually used to make the helium vessel. When the magnet is operated in an AC field environment, eddy currents will be induced in those metal components, generating AC losses. The AC losses add to the total heat load for the refrigeration system because the eddy currents generate heat at cryogenic temperatures, which is expensive to remove. For certain superconducting magnet applications, these AC losses can be significant and requires to be minimized or eliminated if possible.

Thus, there is a need for reducing field effect losses from eddy currents, while providing desired cooling for superconducting magnets.

SUMMARY

In accordance with one aspect of the present technique, a structure for superconducting magnets is provided. The structure includes a thermally conductive electrically resistive composite bobbin, a superconducting coil disposed around the thermally conductive electrically resistive composite bobbin for conducting current in a superconductive state. The structure also includes an electrically open cryogenic coil disposed on the thermally conductive composite electrically resistive bobbin, which can receive a flow of cryogenic fluid to maintain the superconducting coil in the superconductive state by transfer of heat from the superconducting coil to the electrically open cryogenic coil through the thermally conductive electrically resistive composite bobbin. A method for manufacturing the structure for superconducting magnets is also provided. Additionally, a system for reducing eddy current losses in a magnetic resonance (MR) system is also provided.

These and other advantages and features will be more readily understood from the following detailed description of preferred embodiments of the invention that is provided in connection with the accompanying drawings.

DETAILED DESCRIPTION OF EXEMPLARY EMBODIMENTS

In the subsequent paragraphs, an approach for manufacturing a superconducting coil assembly will be explained in detail. The approach described hereinafter produces a superconducting magnet structure with reduced eddy current and field effect losses, such as for magnetic resonance (MR) applications, including magnetic resonance imaging or magnetic resonance spectroscopy. The various aspects of the present technique will be explained, by way of example only, with the aid of figures hereinafter.

Figure 1:
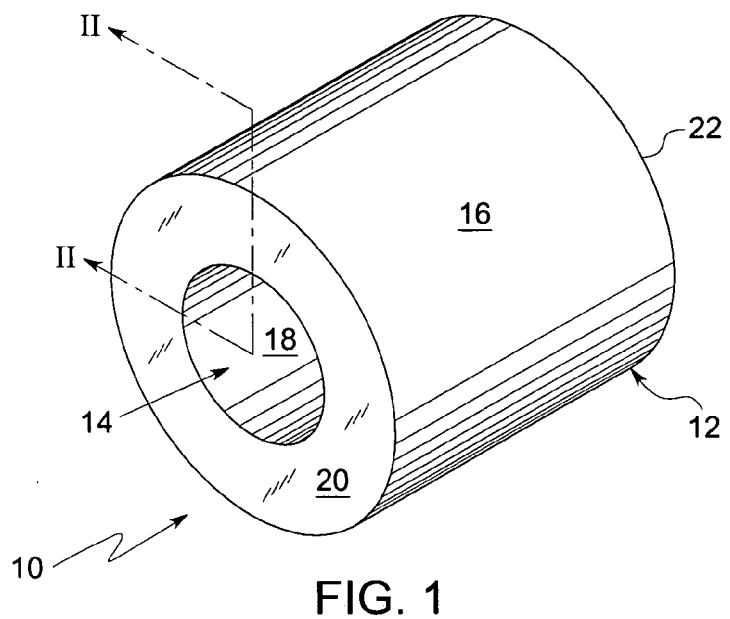
FIG. 1 is a perspective view of a magnet assembly in accordance with aspects of the present technique.

Referring generally to FIG. 1, manufacturing techniques will be described by reference to a magnet assembly designated generally by numeral 10. It should be appreciated, however, that the magnet assembly may find application in a range of settings and systems, and that its use in the MR application discussed is but one such application. The magnet assembly 10 includes an outer shell (vessel) 12 surrounding a bore 14. As will be appreciated by those skilled in the art, in an imaging application, a subject is placed in the bore 14 for imaging. Thus, the bore 14 provides access to the imaging volume for a subject. The outer shell 12 includes an outer lining 16, an inner lining 18, and two annular end lining flanges 20 and 22. The outer lining 16, inner lining 18, and the two annular end lining flanges 20 and 22 together form a closed composite structure that encloses an evacuated volume as described below.

Figure 2:
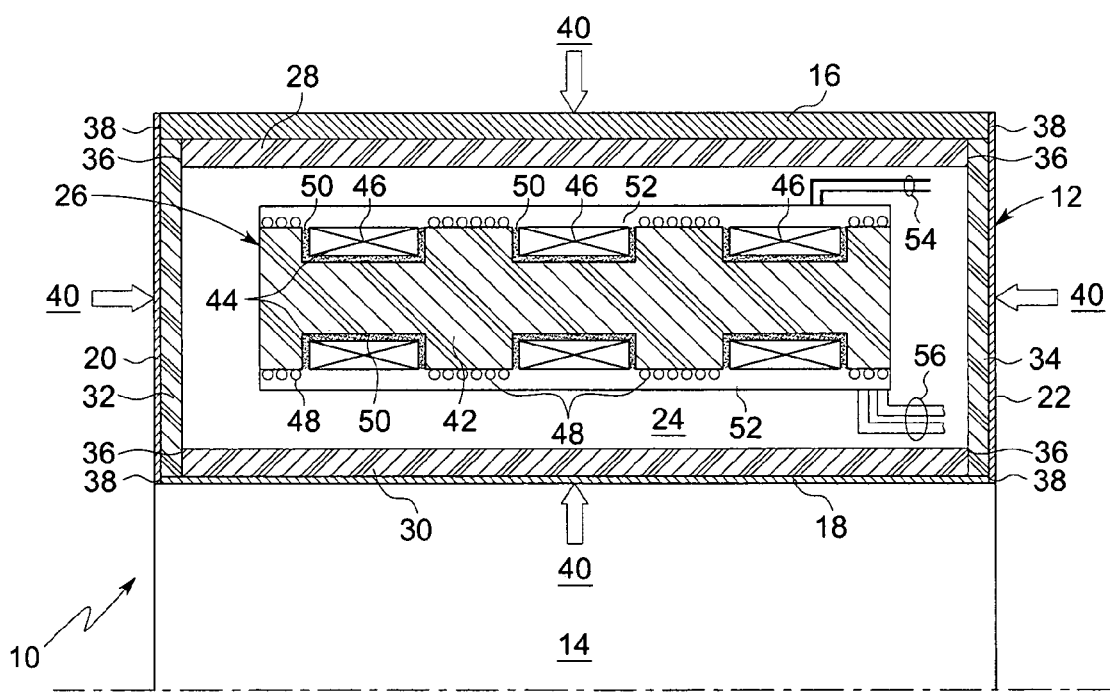
FIG. 2 is a cross-sectional view of the magnet assembly of FIG. 1 taken along line II—II of FIG. 1.

Referring now to FIG. 2, a cross-sectional view of the magnet assembly 10 of FIG. 1 taken along line II—II of FIG. 1, is illustrated. As illustrated, the magnet assembly 10 includes the outer shell 12 surrounding the bore 14. The outer shell 12 is constructed to enclose a vacuum volume or a vacuum cavity 24. Within the vacuum cavity 24, a superconducting magnet assembly 26 is disposed. The outer shell 12 is constructed by disposing a composite outer cylinder 28 over a composite inner cylinder 30 in a concentric fashion. The composite outer cylinder 28 and the composite inner cylinder 30 are closed via two annular flanges 32 and 34, to form a closed composite structure. The composite outer cylinder 28, the composite inner cylinder 30, and the two flanges 32 and 34 may be made of a plastic or fiber material, such as but not limited to, a fiberglass material, a ceramic material, or a synthetic plastic material. Therefore, the two flanges 32 and 34 may be either thermally fused together or even separably joined with the composite outer cylinder 28 and the composite inner cylinder 30 at corners shown generally by reference numeral 36.

The closed composite structure thus formed is then surrounded and sealed by thin metallic sheets that form an external lining over the closed composite structure. An outer metallic lining 16 is disposed proximate to the composite outer cylinder 28, while an inner metallic lining 18 is disposed proximate to the composite inner cylinder 30. Two annular end linings 20 and 22 are disposed proximate to the flanges 32 and 34, respectively. The outer metallic lining 16, the inner metallic lining 18, and the two annular end linings 20 and 22 may be made of metal, such as stainless steel, carbon steel, or aluminum. These components 16, 18, 20, and 22 may be welded together at the edges, as designated generally by reference numeral 38. Thus, the outer shell 12 is a sealed vacuum vessel enclosing the vacuum volume 24, which withstands vacuum forces shown generally by arrows 40.

It may be noted that the magnetic field of MR magnet assembly 10, particularly important within bore 14, is not influenced to a large extent by metallic lining at the outer periphery 16. Therefore, the outer metallic lining 16 may be thicker than the inner metallic lining 18. This is because the superconducting magnet assembly 26 provides a magnetic field that is directed into the bore 14.

The superconducting magnet assembly 26 is disposed within the outer shell 12 in the vacuum volume 24 via mechanically support structures that are not shown for clarity. The superconducting magnet assembly 26 includes a composite bobbin-shaped structure 42, which includes a plurality of recesses 44. The composite bobbin 42 may be made of thermally conductive strands, such as copper, that may be co-wound, intertwined, with fiberglass strands and reinforced with, for example, epoxy to form a composite body.

In each of the recesses 44, is disposed a superconducting coil 46, which may be made of a coil of metallic or ceramic wires, such as of Niobium-Titanium wires. The superconducting coil 46 wound in each recess 44 may be interlinked with that disposed in another proximate recess 44, via electrical couplers or jumpers. A cryogenic coil 48 is wound or disposed over the composite bobbin 42, such that the cryogenic coil 48 is proximate to the composite bobbin 42 in locations not including the recesses 44.

As previously described, the superconducting coil 46 is wound in the recesses 44 of the composite bobbin 42. Each segment of the superconducting coil 46 disposed in each recess 44 may be disposed over an insulating liner 50 that prevents the superconducting coil 46 to be electrically coupled to the composite bobbin 42. The insulating liner 50 may be an epoxy liner, or other electrically insulating material. It may be noted that the wires of the superconducting coil 46 may also be coated with an insulating material. The structure thus formed is coated with a potting material 52 that forms a uniform overlayer. Leads of the superconducting coil 46, shown generally by reference numeral 54, and conduits of the cryogenic coil 48, shown generally by reference numeral 56, may be conducted out of the potting 52 for electrical coupling with magnet operation control circuitry and cryogen feed mechanism (not shown), respectively.

Figure 3:
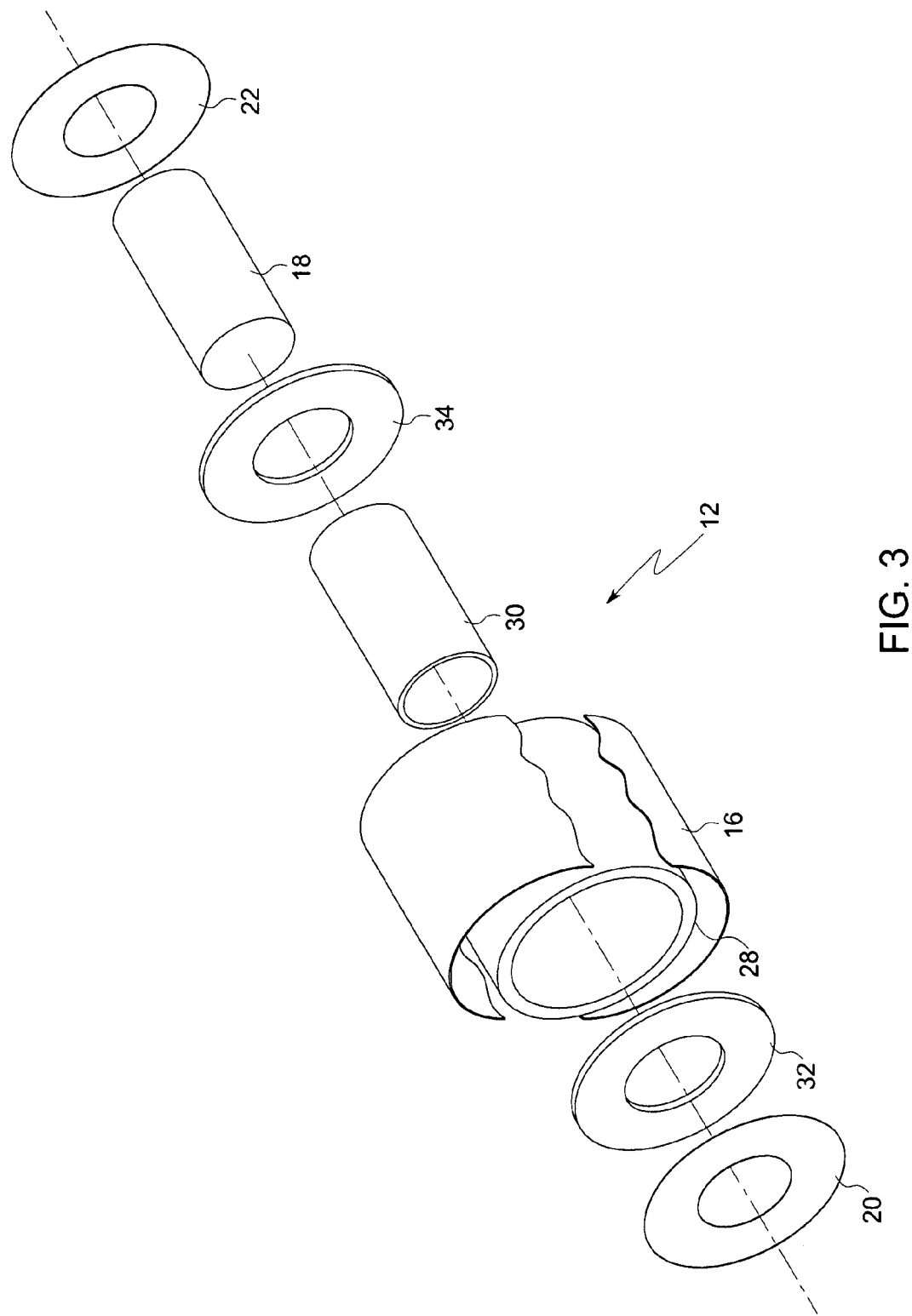
FIG. 3 is an exploded view of an outer shell (vessel) of the magnet assembly of FIG. 1 in accordance with aspects of the present technique.

Turning now to FIG. 3, an exploded view of an outer shell 12 of the magnet assembly 10 of FIG. 1 is shown. As illustrated, the outer shell 12 includes a composite outer cylinder 28 and a composite inner cylinder 30 that are arranged concentric to each other with respect to their central axes. Two annular flanges 32 and 34 are also arranged axially to the composite cylinders 28 and 30, such that the annular flanges 32 and 34 and the composite cylinders 28 and 30 together form the closed composite structure enveloping an annular inner volume. It may be noted that the diameter of the composite outer cylinder 28, and the outer diameters of the annular flanges 32 and 34 are the same. Similarly, the diameter of the composite inner cylinder 30, and the inner diameters of the annular flanges 32 and 34 are the same.

A thin outer metallic lining 16 having diameter substantially equal to the outer diameter of the composite outer cylinder 28 is arranged radially over the composite outer cylinder 28. Another thin inner metallic lining 18 having diameter substantially equal to the inner diameter of the composite inner cylinder 30 is also arranged radially within the composite inner cylinder 30. These metallic linings 16 and 18 are then welded together with two annular end linings 20 and 22, which are also arranged axially to the metallic linings 16 and 18. As noted above, the outer metallic lining 16 may be thicker than the inner metallic lining 18. Moreover, welding of these metallic sheets 16, 18, 20, and 22 ensures the outer shell thus formed to be vacuum-sealed. Because the metallic sheets alone are not sufficiently strong to withstand the forces resulting from the pressure difference across the vessel wall when a vacuum is drawn within the vessel, the underlying composite material provides the necessary strength. At the same time, the lining provides an air-tight boundary to prevent leakage into the vessel through the composite material. The use of thin metal reduces the influence of AC fields on the overall structure.

Figure 4:
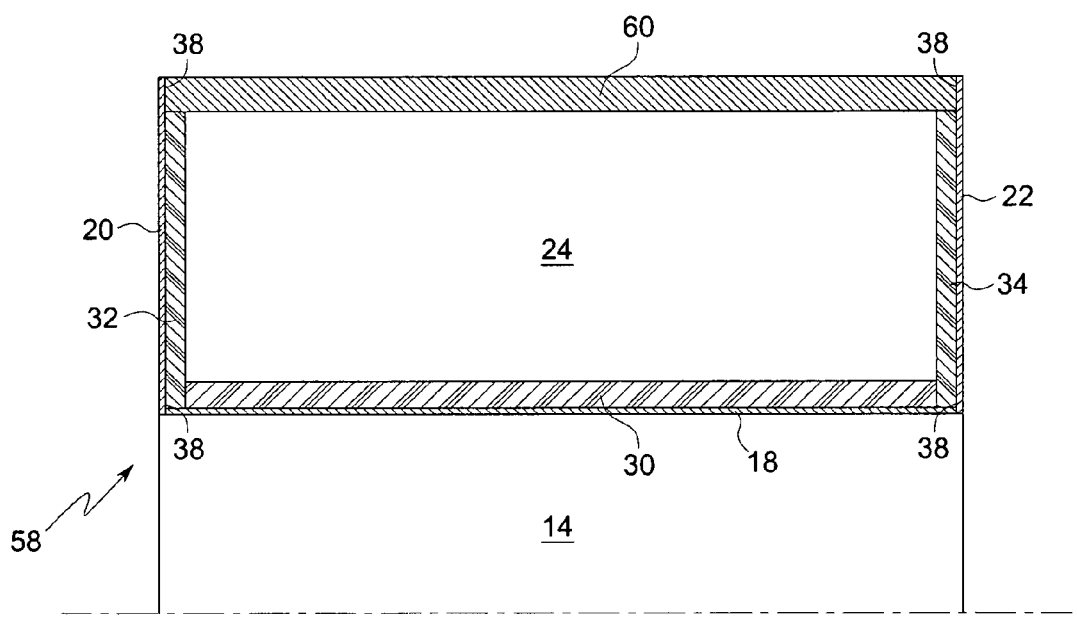
FIG. 4 is a cross-sectional view of an alternative embodiment of the outer shell (vessel) taken along line II—II of FIG. 1 in accordance with aspects of the present technique.

FIG. 4 is a cross-sectional view of an alternative embodiment of an outer shell 58 for use in the magnet assembly of FIG. 1. As illustrated, the outer shell 58 includes a composite inner cylinder 30, and an outer metallic cylinder 60. The composite inner cylinder 30 and the outer metallic cylinder 60 are joined using annular flanges 32 and 34. An inner lining 18, two annular metallic linings 20 and 22 are then welded together at the joints or corners 38. The outer shell thus formed includes a bore 14, as shown. Although, the outer cylinder 60 is made of a metal, the metal cylinder does not interfere with the strong magnetic field generated by the superconducting magnet assembly 26 that is disposed within the vacuum cavity 24. This is because the subject to be scanned or imaged is located within the bore 14, and the magnetic field is directed towards the centre into the bore. The outer cylinder 60 is thus relatively spaced from the more important portion of the field.

Figure 5:
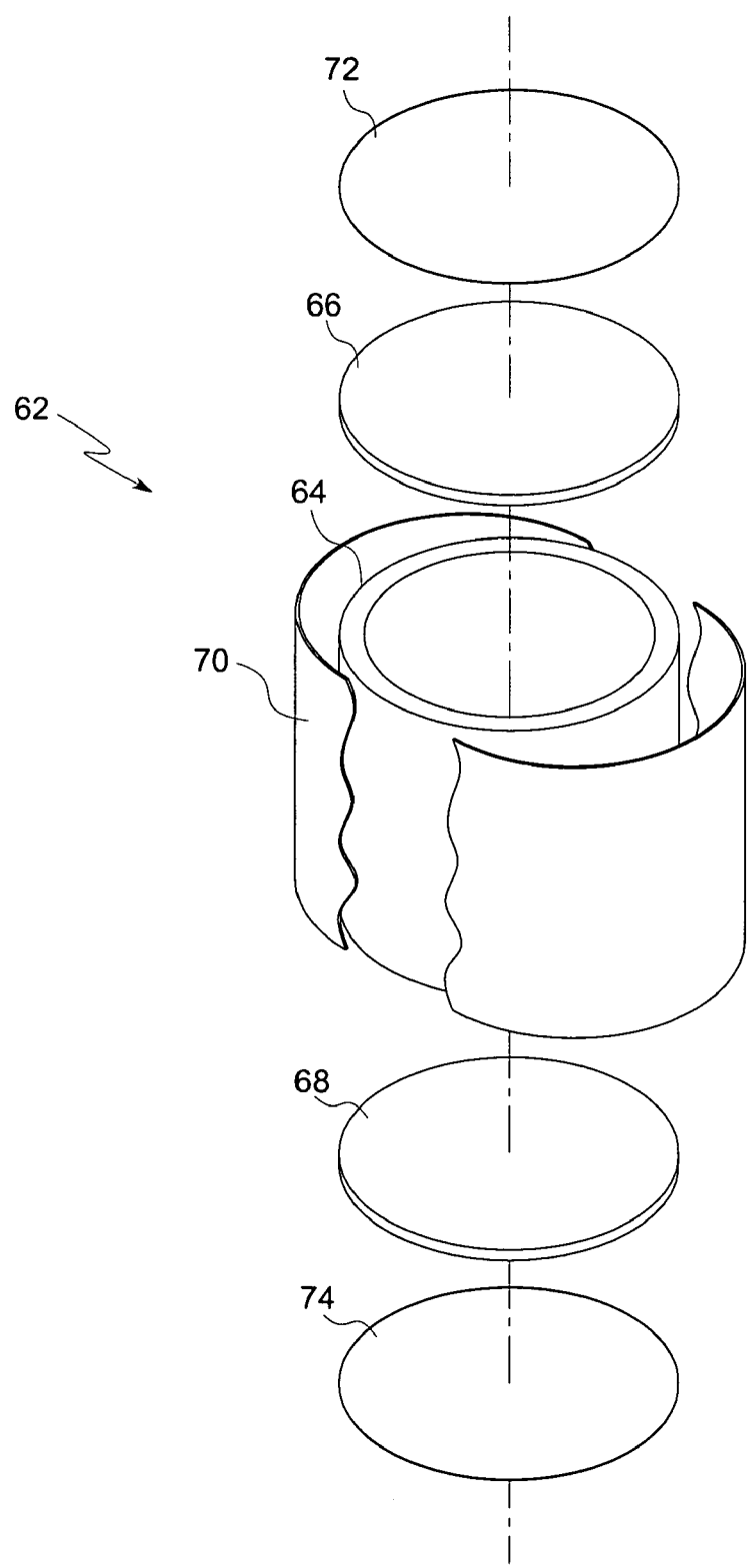
FIG. 5 is an exploded view of an alternative embodiment of an outer shell for use in a magnet assembly in accordance with aspects of the present technique.

Referring generally to FIG. 5, an exploded view of an alternative embodiment of an outer shell 62 for use in a magnet assembly is shown. The outer shell 62 is constructed using a composite cylinder 64, which is joined together via two flanges, an upper composite flange 66, and a lower composite flange 68. The composite cylinder 64 and the composite flanges 66 and 68 may be made of a fiber or plastic material, such as fiberglass, ceramic, or plastic. These components 64, 66, and 68 may be thermally fused or joined to form a closed pancake-shaped structure. A thin metallic outer lining 70 having an inner diameter substantially equal to the outer diameter of the composite cylinder 64 is then welded with two metallic discs, an upper metallic lining 72 and a lower metallic lining 74. The outer shell 62 thus formed includes a vacuum volume or a vacuum cavity, within which is disposed a superconducting magnet assembly. Such a magnet assembly may be utilized for an open MR system, such as an open MRI or open magnetic resonance spectroscopy systems.

Figure 6:
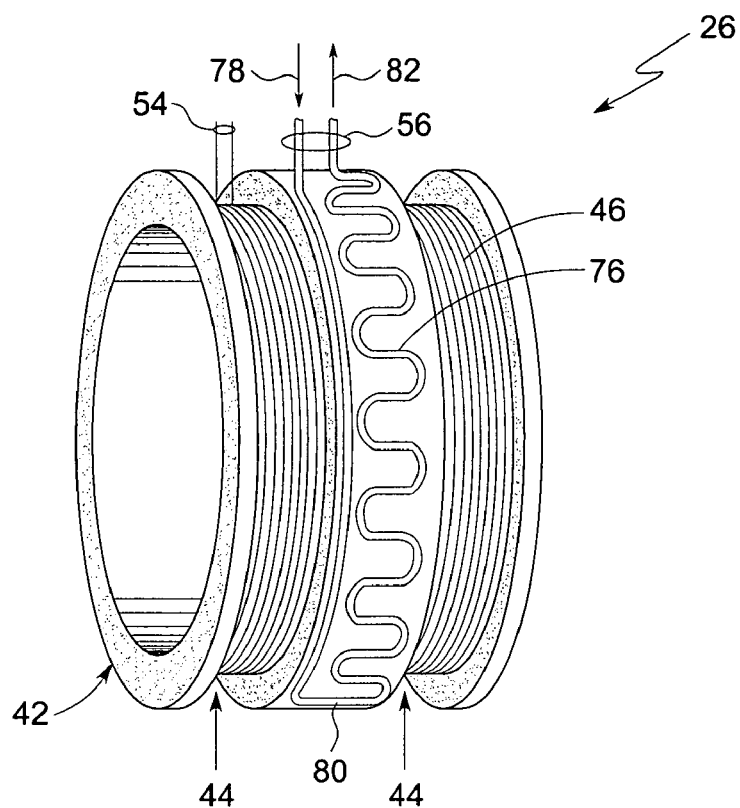
FIG. 6 is a diagrammatic view of a horizontally-oriented superconducting magnet in accordance with aspects of the present technique.

FIG. 6 is a diagrammatic view of a superconducting magnet that may be disposed horizontally within an outer shell of a magnet assembly in an MR system. As shown, the composite bobbin 42 of the superconducting magnet assembly 26 includes recesses 44. Although only two recesses 44 are shown, the composite bobbin 42 may include more recesses. The recesses 44 are wound with a superconducting coil 46. The superconducting coil 46 in the two recesses 44 are joined together via jumpers or electrical coupling that runs over the composite bobbin 42. Leads 54 of the superconducting coil 46 are conducted to electrical coupling with a magnet operation control circuitry. A cryogen coil 76 is arranged over the composite bobbin 42 in an anti-vapor-locking configuration, as shown. For example, in a horizontally-oriented superconducting magnet structure 26, the cryogen coil 76 may be disposed in a commonly known refrigerator cooling coil configuration. This refrigerator cooling coil configuration in the horizontally-oriented superconducting magnet structure 26 prevents vapor-locking of the cryogen, as will be appreciated by those skilled in the art. The cryogen feed mechanism feeds liquid helium, or other cryogen known in the art, into the cryogen coil 76 in a direction shown generally by reference numeral 78. The cryogen flows down into the bottom 80 of the cryogen coil 76. As the cryogen cools the superconducting magnet 26, the cryogen vaporizes and passes through the serpentine cryogen coil 76, without any cryogen vapor being locked in the cryogen coil 76. The vaporized cryogen escapes into the cryogen feed mechanism in the direction generally shown by reference numeral 82.

The composite bobbin 42, made of thermally conductive material, as described previously helps in conducting heat away from the superconducting coils thus maintaining superconducting operation. The generated heat is conducted away towards the cryogenic coil 48. The thermally conductive composite bobbin 42 therefore reduces the thermal gradient between the superconducting coil 46 and the cryogenic coil 48.

Figure 7:
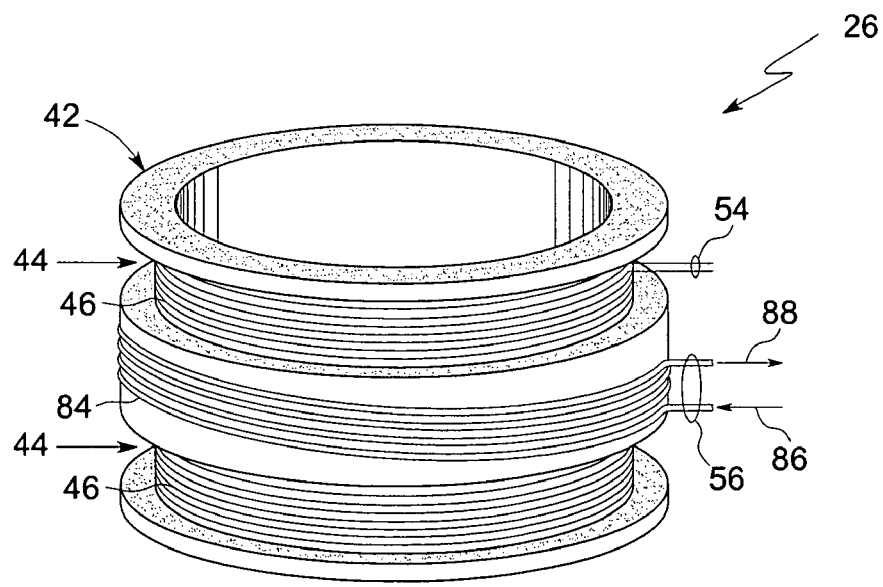
FIG. 7 is a diagrammatic view of a vertically-oriented superconducting magnet in accordance with aspects of the present technique.

FIG. 7 is a diagrammatic view of a superconducting magnet that may be disposed vertically within an outer shell of a magnet assembly in an MR system. FIG. 7 shows the composite bobbin 42 of the superconducting magnet assembly 26 including the recesses 44. As shown, cryogen coil 84 is arranged over the composite bobbin 42 in an anti-vapor-locking configuration. In this vertically-oriented superconducting magnet structure 26, the cryogen coil 84 is disposed in a helical configuration. Again, this helical configuration in the vertically-oriented superconducting magnet structure 26 prevents vapor-locking of the cryogen. The cryogen feed mechanism feeds cryogen into the cryogen coil 84 in a direction shown generally by reference numeral 86. The cryogen cools the superconducting magnet 26 and vaporizes through the spiral cryogen coil 84. The vaporized cryogen escapes into the cryogen feed mechanism in the direction generally shown by reference numeral 88.

Figure 8:
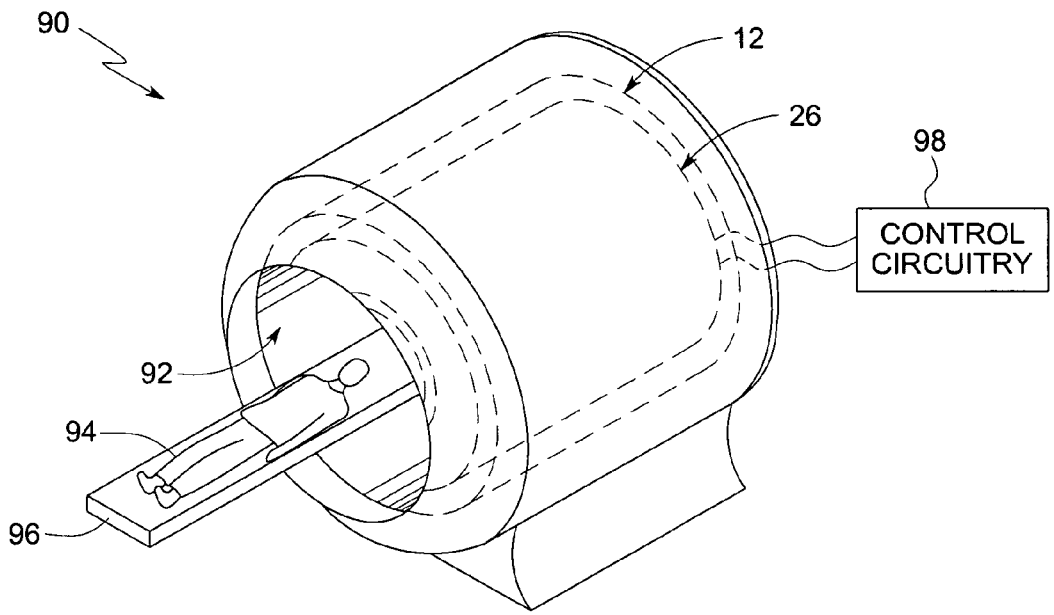
FIG. 8 is a diagrammatic representation of a closed MR system illustrating a superconducting magnet assembly disposed within the MR system in accordance with aspects of the present technique.

The forgoing structures may be used in a range of systems and applications, such as for magnetic resonance imaging. Referring generally to FIG. 8, a magnetic resonance (MR) system 90, such as for a magnetic resonance imaging or magnetic resonance spectroscopy application, is shown in which the forgoing structures are incorporated. The MR system 90 shows a closed MR system, having a bore 92 for receiving a subject 94. Subject 94 may lie over a patient table 96 that may be introduced into the bore 92. A magnet assembly 10 including a superconducting magnet assembly 26 made via the techniques discussed above may be utilized to generate the magnetic field for the MR system 90. The superconducting operation may be controlled via an imaging control circuitry 98.

Figure 9:
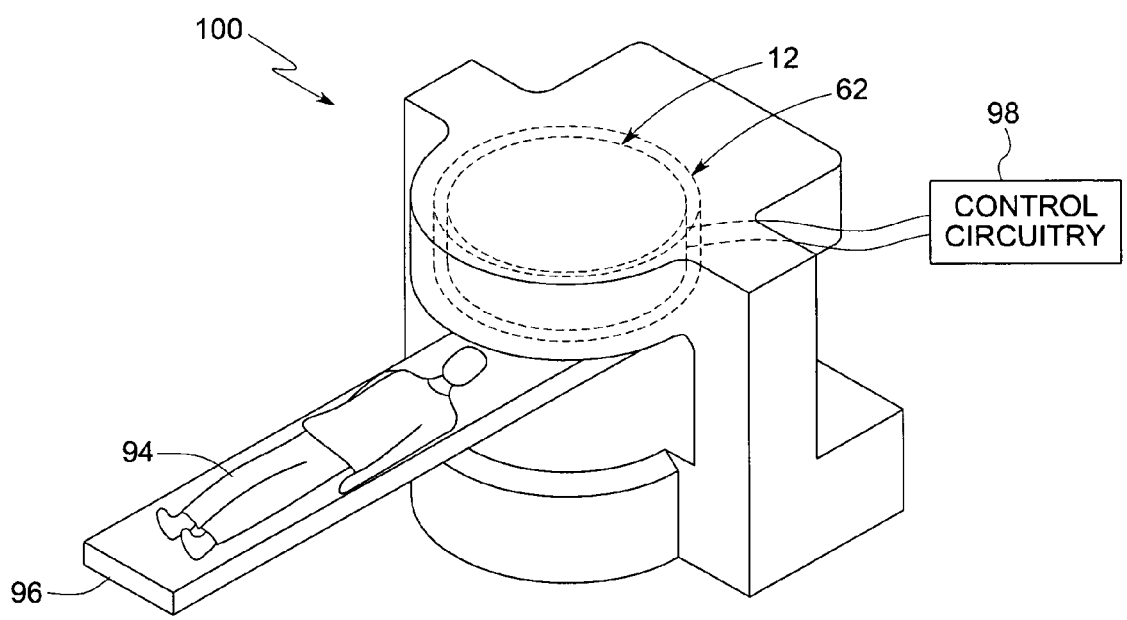
FIG. 9 is a diagrammatic representation of an open MR system illustrating a superconducting magnet assembly disposed within the MR system in accordance with aspects of the present technique.

Referring now to FIG. 9, an open MR system 100 is shown. The magnetic field for the open MR system 100 may be generated by a magnet assembly 10. The magnet assembly 10 may include an outer shell 62, constructed in accordance with the teachings of FIG. 5. Within the outer shell 62, a superconducting magnet assembly 26 may be disposed, which may have a thick disc shape without a bore. Again, the superconducting operation may be controlled via an imaging control circuitry 98.

Although the embodiments illustrated and described hereinabove represent only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the magnet assembly 10 including the outer shell 12 that encloses the superconducting magnet assembly 26, may be constructed in a conventional patient bore configuration, an open MRI configuration, a long-U configuration, among others.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A structure for superconducting magnets, comprising:
    a thermally conductive electrically resistive composite bobbin, the bobbin including an electrically resistive body and a plurality of thermally conductive elements dispersed in the body and electrically isolated from one another;
    a superconducting coil disposed around the thermally conductive electrically resistive composite bobbin for conducting current in a superconductive state; and
    a cryogenic coil disposed on the thermally conductive electrically resistive composite bobbin and configured to receive a flow of cryogenic fluid to maintain the superconducting coil in the superconductive state by transfer of heat from the superconducting coil to the cryogenic coil through the thermally conductive electrically resistive composite bobbin.

2. The structure of claim 1, wherein the thermally conductive electrically resistive composite bobbin comprises thermally conductive strands.

3. The structure of claim 2, wherein the thermally conductive electrically resistive composite bobbin comprises fiberglass in a resinous body, the fiberglass and the thermally conductive strands being embedded in the resinous body.

4. The structure of claim 1, wherein the thermally conductive electrically resistive composite bobbin includes thermally conductive wires electrically insulated from each other.

5. The structure of claim 1, wherein the superconducting coil comprises conductive wires, and wherein the conductive wires are insulated from each other.

6. The structure of claim 1, wherein the thermally conductive electrically resistive composite bobbin includes at least one recess, the superconducting coil being disposed in the at least one recess.

7. The structure of claim 6, comprising an electrical insulating material disposed in the at least one recess and configured to insulate the thermally conductive electrically resistive composite bobbin from the superconducting coil.

8. The structure of claim 1, wherein the cryogenic coil is disposed between portions of the superconducting coil.

9. The structure of claim 1, comprising a layer of electrical insulation disposed over the superconducting coil and the cryogenic coil.

10. The structure of claim 1, wherein the cryogenic coil is epoxy bonded to the thermally conductive electrically resistive composite bobbin.

11. The structure of claim 1, wherein the cryogenic coil is disposed in an anti-vapor-locking configuration over the thermally conductive electrically resistive composite bobbin.

12. A method for manufacturing a structure for superconducting magnets, comprising:
    winding a superconducting coil around a thermally conductive electrically resistive composite bobbin for conducting current in a superconductive state, the bobbin including an electrically resistive body and a plurality of thermally conductive elements dispersed in the body and electrically isolated from one another, and
    disposing a cryogenic coil on the thermally conductive electrically resistive composite bobbin for receiving a flow of cryogenic fluid to maintain the superconducting coil in the superconductive state by transfer of heat from the superconducting coil to the cryogenic coil through the thermally conductive electrically resistive composite bobbin.

13. The method of claim 12, comprising forming the thermally conductive electrically resistive composite bobbin by disposing fiberglass and conductive strands within a resinous body.

14. The method of claim 12, comprising forming at least one recess in the thermally conductive electrically resistive composite bobbin for receiving superconducting coil.

15. The method of claim 14, wherein winding the superconducting coil comprises winding the superconducting coil into the at least one recess.

16. The method of claim 14, comprising disposing an electrical insulating material in the at least one recess between the thermally conductive electrically resistive composite bobbin and the superconducting coil.

17. The method of claim 12, wherein winding the superconducting coil comprises winding conductive wires such that the conductive wires are insulated from each other.

18. The method of claim 12, wherein disposing the cryogenic coil comprises disposing the cryogenic coil between portions of the superconducting coil.

19. The method of claim 12, wherein disposing the cryogenic coil comprises bonding the cryogenic coil to the thermally conductive electrically resistive composite bobbin via epoxy.

20. The method of claim 12, wherein disposing the cryogenic coil comprises disposing the cryogenic coil in an anti-vapor-locking configuration over the thermally conductive electrically resistive composite bobbin.

21. A system for reducing eddy current losses in a magnetic resonance (MR) system, comprising:
    a superconducting magnet assembly, including:
        a thermally conductive electrically open composite bobbin, the bobbin including an electrically resistive body and a plurality of thermally conductive elements dispersed in the body and electrically isolated from one another,
        a superconducting coil disposed around the thermally conductive composite bobbin for conducting current in a superconductive state; and
        a cryogenic coil disposed on the thermally conductive composite bobbin and configured to receive a flow of cryogenic fluid to maintain the superconducting coil in the superconductive state;
    a patient table for supporting a patient;
    a plurality of gradient coils disposed adjacent to the superconducting magnet assembly; and
    an imaging circuitry for controlling operation of the system.

22. A structure for superconducting magnets, comprising:
    a thermally conductive electrically resistive composite bobbin, wherein the thermally conductive electrically resistive composite bobbin includes at least one recess;
    a superconducting coil disposed around the thermally conductive electrically resistive composite bobbin for conducting current in a superconductive state, the superconducting coil being disposed in the at least one recess; and
    a cryogenic coil disposed on the thermally conductive electrically resistive composite bobbin and configured to receive a flow of cryogenic fluid to maintain the superconducting coil in the superconductive state by transfer of heat from the superconducting coil to the cryogenic coil through the thermally conductive electrically resistive composite bobbin.

23. A structure for superconducting magnets, comprising:
    a thermally conductive electrically resistive composite bobbin, wherein the thermally conductive electrically resistive composite bobbin includes at least one recess, the recess comprising an electrical insulating material disposed in the at least one recess and configured to insulate the thermally conductive electrically resistive composite bobbin from the superconducting coil;
    a superconducting coil disposed around the thermally conductive electrically resistive composite bobbin for conducting current in a superconductive state; and
    a cryogenic coil disposed on the thermally conductive electrically resistive composite bobbin and configured to receive a flow of cryogenic fluid to maintain the superconducting coil in the superconductive state by transfer of heat from the superconducting coil to the cryogenic coil through the thermally conductive electrically resistive composite bobbin.

* * * * *